US007004376B2

(12) United States Patent
Ashida

(10) Patent No.: US 7,004,376 B2
(45) Date of Patent: Feb. 28, 2006

(54) SOLDER PRINTING MASK, WIRING BOARD AND PRODUCTION METHOD THEREOF, ELECTROOPTICAL APPARATUS AND PRODUCTION METHOD THEREOF AND ELECTRONIC DEVICE AND PRODUCTION METHOD THEREOF

(75) Inventor: Takeshi Ashida, Matsumoto (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/666,546

(22) Filed: Sep. 19, 2003

(65) Prior Publication Data
US 2004/0222272 A1    Nov. 11, 2004

(30) Foreign Application Priority Data
Sep. 20, 2002    (JP)    .............................. 2002-275177

(51) Int. Cl.
  B23K 31/02    (2006.01)
  B23K 35/12    (2006.01)
  H01L 29/40    (2006.01)
(52) U.S. Cl. ...................... 228/215; 228/245; 228/256; 257/772; 257/780; 438/612
(58) Field of Classification Search .................. 228/39, 228/180.21, 180.22, 215, 245, 246, 248.1, 228/256; 438/612–614; 257/772, 780
See application file for complete search history.

(56) References Cited

U.S. PATENT DOCUMENTS 5,519,580 A    5/1996    Natarajan et al.
5,931,577 A *  8/1999    Ishibashi .................... 362/249
6,165,885 A * 12/2000    Gaynes et al. ............... 438/612
6,208,791 B1 * 3/2001    Bischel et al. .............. 385/129
6,337,445 B1 * 1/2002    Abbott et al. ................ 174/260
6,564,454 B1 * 5/2003    Glenn et al. .................. 29/852
6,622,380 B1 * 9/2003    Grigg ........................... 29/840
6,630,742 B1 * 10/2003   Sakuyama .................. 257/772
2002/0093091 A1  7/2002  Huang et al.
2003/0010975 A1* 1/2003  Gibb et al. ................... 257/40
2004/0169288 A1* 9/2004  Hsieh et al. ................ 257/780
2004/0212030 A1* 10/2004 Asai .......................... 257/432

FOREIGN PATENT DOCUMENTS

JP    06-267964    9/1994
JP    10-084002    3/1998

OTHER PUBLICATIONS

Communication from Chinese Patent Office regarding counterpart application.
Communication from Korean Patent Office re: related application.

* cited by examiner

Primary Examiner—Lynne R. Edmondson
(74) Attorney, Agent, or Firm—Harness, Dickey & Pierce, P.L.C.

(57) ABSTRACT

There is provided a mask for use in printing solder on a plurality of terminals formed on a substrate so as to correspond to a plurality of terminals of an IC package. The mask has openings through which the solder is applied, and the openings are larger than the terminals. Although a wiring line adjacent to the terminals may be covered with the solder, a reflow process causes the solder to be divided into a first portion and a second portion, thus preventing short-circuits between the wiring line and the terminals.

4 Claims, 16 Drawing Sheets

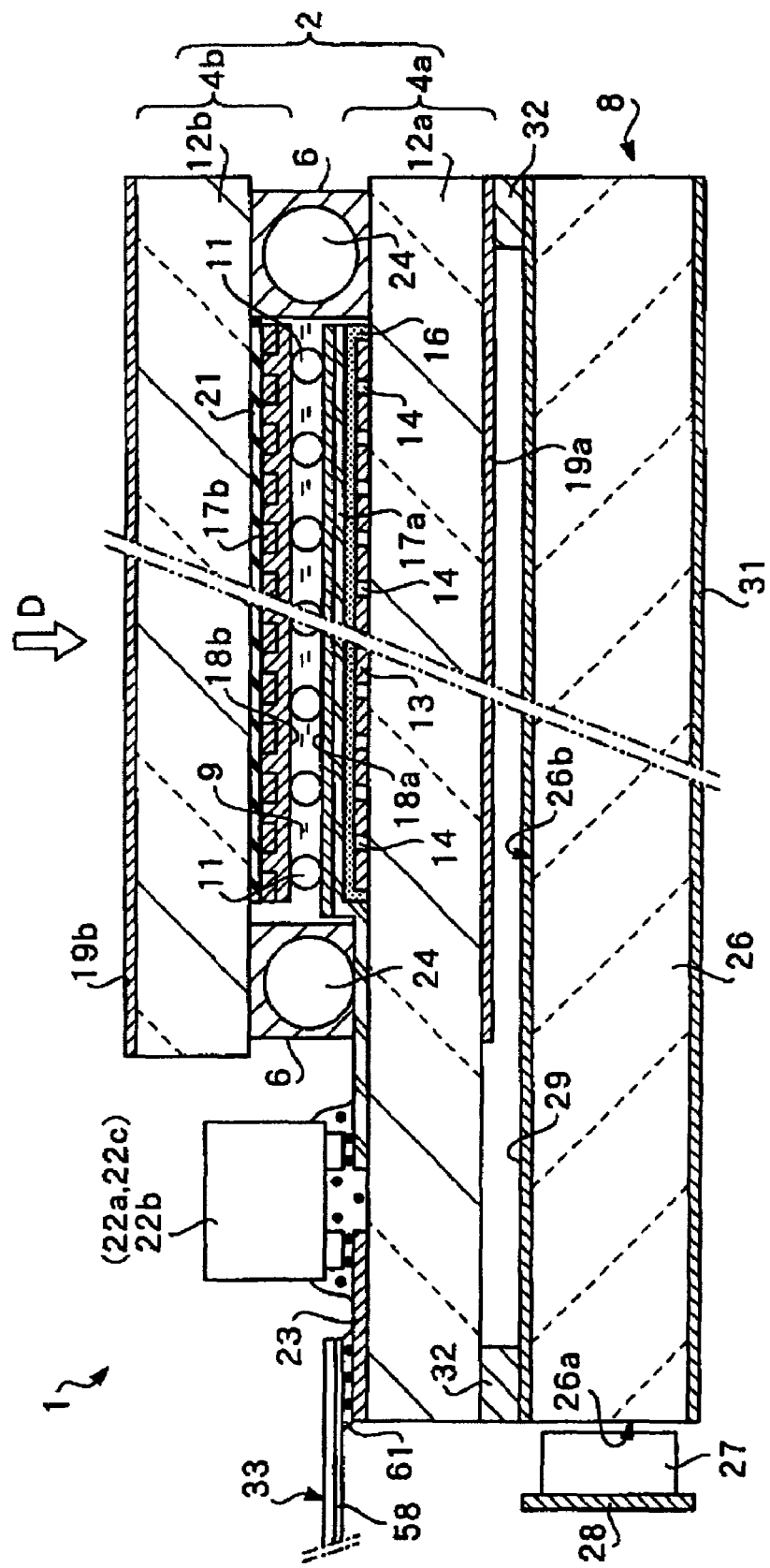

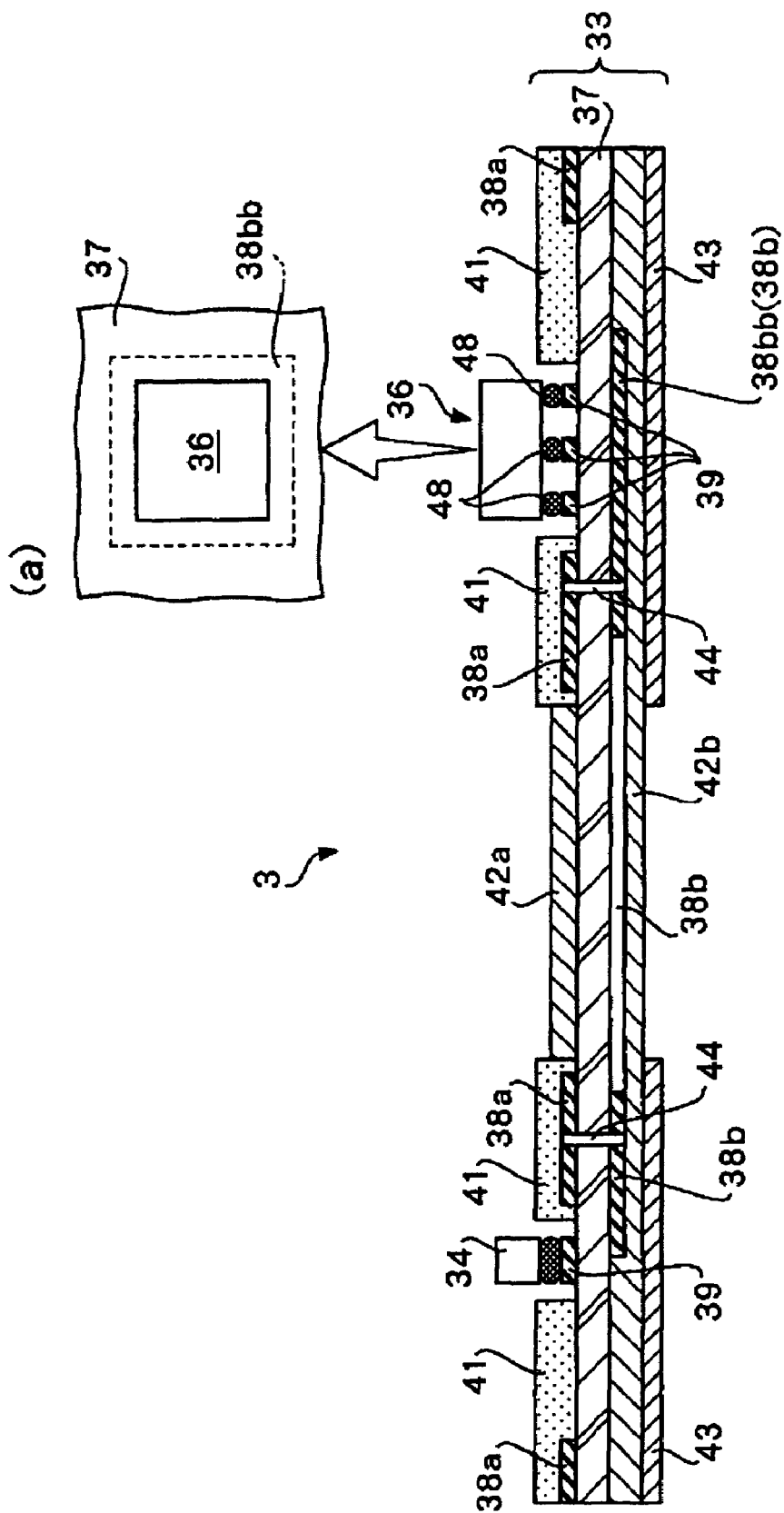

SOLDER PRINTING MASK, WIRING BOARD AND PRODUCTION METHOD THEREOF, ELECTROOPTICAL APPARATUS AND PRODUCTION METHOD THEREOF AND ELECTRONIC DEVICE AND PRODUCTION METHOD THEREOF

BACKGROUND OF THE INVENTION

1. Technical Field

The present invention relates to (1) a mask for use in printing solder on a substrate, (2) a wiring board production method using the mask, (3) a wiring board which is produced by this production method, (4) an electrooptical apparatus production method using the wiring board production method, (5) an electrooptical apparatus which is produced by the electrooptical apparatus production method, (6) an electronic device production method using the electrooptical apparatus production method, and (7) an electronic device which is produced by this production method.

2. Related Art

As is known in the art, a wiring board formed by mounting an IC chip on a base has a structure in which the IC chip is mounted on a base material using an ACF (Anisotropic Conductive Film). An ACF is formed, for example, as shown in reference numeral 201 in FIG. 16, by dispersing a plurality of conductive particles 203 in insulating resin 202.

When an IC chip 204 is mounted on a base 206, the ACF 201 is affixed to terminals 207 formed on the base 206 and the IC chip 204 is placed on the ACF 201, and then the IC chip 204 is pressed against the base 206 while heating; that is, it is subjected to thermal compression.

The thermal compression causes the main portion of the IC chip 204 to be fixed to the base 206 at a predetermined position due to the action of the resin 202 in the ACF 201. At the same time, a plurality of electrode terminals or bumps 208 formed on an active surface of the IC chip 204 are electrically connected to the terminals 207 formed on the base 206 via the conductive particles 203 of the ACF 201.

Electronic parts such as capacitors and resistors as well as the IC chip 204 are generally mounted on the above-described wiring board formed using the ACF 201.

Typically, such electronic parts are subjected to solder reflow for mounting on a base by soldering.

Therefore, when an electronic part such as a capacitor and an IC chip are mounted on a base, such a related-art wiring board using the ACF 201 must be subjected to two separate processes, i.e., thermal compression with respect to the ACF 201 and solder reflow, leading to a problem that the production cost increases.

In the case of solder reflow after the IC chip 204 is mounted using the ACF 201, there is another problem in that the ACF 201 which carries the IC chip 204 may be stripped off from the base 206 due to heat generated in the solder reflow process, resulting in conduction defects.

Recently, IC packages having a plurality of terminals on the bottom surface thereof, like BGA (Ball Grid Array) or CSP (Chip Sized Package), have been offered for practical use. For example, the IC packages for BGA and CSP shown in FIGS. 15(a) and 15(b) are known.

Specifically, an IC package 211 shown in FIG. 15(a) is constructed such that an IC chip 216 bonded on a surface of a circuit board 213 via bonding wires 214 is overcoated with a sealing member 217 to package the IC chip 216. A plurality of wiring lines are formed on the surface of the circuit board 213 on which the IC chip 216 is mounted, and a plurality of wiring lines are also formed on the rear side of the circuit board 213. The wiring lines formed on both sides are electrically connected with each other via through-holes (not shown) extending through the circuit board 213. On the rear side, solder bump terminals 218, each corresponding to one of the plurality of wiring lines, are formed in, for example, a lattice or a matrix.

An IC package 212 shown in FIG. 15(b) is constructed such that an IC chip 216 is bonded, that is, flip-chip bonded, via a plurality of ball electrodes 219 formed in a predetermined pattern on the front surface of a circuit board 213. The IC chip 216 is overcoated with a sealing member 217 and so is packaged. A plurality of wiring lines are formed on the rear side of the circuit board 213, and solder bump terminals 218, each corresponding to one of the wiring lines, are formed in, for example, a lattice or a matrix. The IC package 212 can be designed so that it has substantially the same size as the IC chip 216.

In the IC packages shown in FIGS. 15(a) and 15(b), the IC chip 216 is mounted on the circuit board 213, whereas another known IC package, called WCSP (Wafer-Level CSP (Chip Sized Package)), is configured such that the IC chip 216 is not mounted on the circuit board 213 but the solder bump terminals 218 are mounted directly on terminals or pads on the IC chip 216.

The structure common to IC packages including the IC package 211 shown in FIG. 15(a) and the IC package 212 shown in FIG. 15(b) is that the solder bump terminals 218 are formed on the bottom surface, that is, the large-area surface, of the IC package. Such packages having the plurality of solder bump terminals 218 on the bottom or large-area surface thereof can be electrically connected to a wiring board via the solder bump terminals 218 without a conductive adhesive element, such as an ACF. In a case where electronic parts in addition to an IC chip are mounted on a wiring board, the electronic parts and the IC chip can be mounted at the same time, thus reducing the production cost.

When an IC package having terminals on the bottom surface thereof, like BGA, is mounted on a substrate, typically, solder is deposited by printing on a plurality of terminals formed on the substrate, and the IC package, which is positioned so that the terminals of the IC package will be located on the printed solder, is mounted or placed on the substrate. The solder is melted by solder reflow or the like, and the IC package is therefore soldered onto the substrate.

When solder is printed on a plurality of terminals on a substrate, typically, a mask having openings corresponding to the terminals is placed on the substrate, and solder, e.g., cream solder, is spread out over the mask using a squeegee so that the solder is applied over the substrate terminals through the openings. The openings in the mask are generally the same size as or smaller than the substrate terminals in order that short-circuits are not caused by solder printed in the wrong position.

However, if the openings in the mask are the same as or smaller than the terminals on the substrate, the contact area between the solder applied to the substrate terminals via the openings in the mask and the substrate terminals, i.e., the conduction area, decreases, resulting in conduction defects in some cases.

The present invention has been made in view of the foregoing problems, and it is an object of the present invention to constantly ensure a sufficient contact area between the solder and a plurality of terminals formed on a substrate when the solder is printed on the terminals.

SUMMARY

In order to achieve the foregoing object, a mask according to the present invention is characterized in that a mask for use in printing solder on a plurality of terminals formed on a substrate so as to correspond to a plurality of terminals of an IC package has openings through which the solder is applied, and the openings are larger than the terminals.

According to this structure, solder (for example, reference numeral 64 in FIG. 6(*c*)) applied over the substrate through the openings in the mask is larger than the terminal (for example, reference numeral 39 in FIG. 6(*c*)) on the substrate 33, thus ensuring a sufficient contact area between the substrate terminal 39 and the solder 64 applied thereto even when the mask (for example, reference numeral 62 in FIG. 6(*a*)) having openings (for example, reference numeral 63 in FIG. 6(*a*)) is offset from the correct position on the substrate 33.

Preferably, the mask is used for a substrate which is subjected to solder reflow. The solder reflow is a process of heating an IC-package-mounted substrate in a reflow oven which is heated to a certain high temperature, thus causing the solder to be melted to solder the IC package onto the substrate.

When the area of the solder applied on the substrate is larger than that of a terminal on the substrate and the solder is heated in the reflow oven, the solder whose area is larger than that of the terminal on which the solder had been applied is shrunk towards the terminal and is coagulated. This prevents the solder from expanding considerably beyond the terminal on the substrate when the soldering process is completed.

For example, as shown in FIG. 6(*b*), the mask according to the present invention can be used for a substrate having a conductive region 38*a* formed between at least one pair of a plurality of substrate terminals 39. Preferably, the openings 63 in the mask are large enough to extend between one member of the pair of the substrate terminals 39 and the conductive region 38*a*.

Thus, the area of the solder applied over the substrate is larger than that of the terminal 39, as shown in FIG. 6(*c*) by reference numeral 64, and a portion of the solder 64 covers the conductive region 38*a*. When the resulting substrate is heated in a reflow oven, the solder 64 is divided into two portions one of which is shrunk towards the conductive region 38*a* while the other is shrunk towards the terminal 39.

In a wiring board to which the above-described mask is applied, between a pair of adjacent substrate terminals, a wiring line extending from one of the substrate terminals may be placed, serving as a conductive region. Preferably, the openings in the mask are large enough to extend between the wiring line and this substrate terminal. However, if the pitch between the terminals is large, the openings in the mask do not cover the conductive region.

A wiring board production method according to the present invention is characterized in that the wiring board production method includes a step of applying solder through openings in a mask to each of a plurality of substrate terminals formed on a substrate so as to correspond to a plurality of terminals of an IC package, wherein the area of the solder applied to each of the substrate terminals is larger than that of the substrate terminal.

According to this wiring board production method, the area of the applied solder is larger than that of the terminals, thus ensuring a sufficient contact area between the terminals on the substrate and the solder applied thereto even when the mask is offset from the correct position on the substrate.

Preferably, the wiring board production method further includes a solder reflow step of causing the solder applied to the substrate to be melted. When a substrate over which the area of the applied solder is larger than that of a terminal on the substrate is heated in a reflow oven, the solder whose area is larger than that of the terminal on which the solder had been applied is shrunk towards the terminal and is coagulated. This prevents the solder from expanding considerably beyond the terminal on the substrate when the soldering process is completed.

The wiring board production method according to the present invention can be applied to a wiring board having a conductive region formed between at least one pair of a plurality of substrate terminals. In the step of applying solder, the solder can be applied to the substrate so that one of the substrate terminals is entirely covered with the solder and a portion of or the entire width of the conductive region is covered with the solder.

This ensures that the above-noted one substrate terminal is entirely covered with the solder. The solder, which is initially applied to both the substrate terminal and the conductive region, is divided into two portions one of which is shrunk towards the substrate terminal while the other towards the conductive region after the soldering operation using solder reflow or the like, and no short-circuit occurs therebetween. However, if the pitch between the terminals is large, the conductive region is not necessarily covered.

In a wiring board to which the above-described wiring board production method is applied, between a pair of adjacent substrate terminals, a wiring line extending from one of the substrate terminals may be placed serving as a conductive region. Preferably, the solder is applied to the substrate so as to extend over the wiring line and this substrate terminal.

This ensures that the above-noted one substrate terminal is entirely covered with the solder. The solder, which is initially applied to both the substrate terminal and the wiring line, is divided into two portions one of which is shrunk towards the substrate terminal while the other towards the wiring line after the soldering operation using solder reflow or the like, and no short-circuit occurs therebetween.

A wiring board according to the present invention is characterized by being produced using the above-described wiring board production method. According to the above-described wiring board production method, a sufficient amount of solder can be provided between the terminals of the IC package and the terminals on the substrate, thus ensuring that the occurrence of conduction defects in the IC package of the wiring board of the present invention formed using this production method is prevented.

An electrooptical apparatus production method according to the present invention is characterized by including a step of implementing the above-described wiring board production method. The electrooptical apparatus may be implemented as a liquid crystal apparatus using a liquid crystal as an electrooptical material, an EL apparatus using an organic EL (Electro Luminescence) as an electrooptical material, a plasma apparatus using lean gas as electrooptical material and using plasma discharge generated in the gas, or other apparatuses.

According to the above-described wiring board production method, a sufficient amount of solder can be provided between the terminals of the IC package and the terminals on the substrate, thus ensuring that the occurrence of conduction defects in the IC package of a wiring board formed using this production method is prevented. Therefore, a high-reliability electrooptical apparatus can be produced.

An electrooptical apparatus according to the present invention is characterized by being produced using the above-described electrooptical apparatus production method. Thus, a high-reliability electrooptical apparatus without conduction defects of the IC package is achievable.

An electronic device production method according to the present invention is characterized by including a step of implementing the above-described electrooptical apparatus production method. Thus, a high-reliability electronic device without conduction defects of the IC package is achievable.

An electronic device according to the present invention is characterized by being produced using the above-described electronic device production method. Thus, a high-reliability electronic device without conduction defects of the IC package is achievable.

An electrooptical apparatus production method according to the present invention can further include a step of forming a liquid crystal layer. Thus, a liquid crystal electrooptical apparatus can be produced. More specifically, electrodes are formed on a single substrate, while other electrodes facing those electrodes are formed on a substrate facing this substrate, and these substrates are bonded to each other with a cell gap between them into which a liquid crystal is injected, thereby forming a liquid crystal layer between the pair of substrates.

According to the electrooptical apparatus production method according to the present invention, a wiring board formed using the solder printing mask according to the present invention is connected to one or both of the pair of substrates forming the liquid crystal apparatus. In the resulting wiring board, the occurrence of conduction defects in the IC package is reliably prevented, and a high-reliability electrooptical apparatus can also be produced.

BRIEF DESCRIPTION OF THE DRAWINGS

FIG. 2 is a cross-sectional view of a liquid crystal panel which forms a main portion of the electrooptical apparatus shown in FIG. 1.

FIG. 3 is a cross-sectional view showing the cross section of the wiring board shown in FIG. 1.

DETAILED DESCRIPTION

Embodiment of Wiring Board

A wiring board according to the present invention is described below in conjunction with an embodiment thereof. The following embodiment is merely an example for aiding the understanding of the present invention, and the present invention is not limited to this embodiment.

Figure 1:
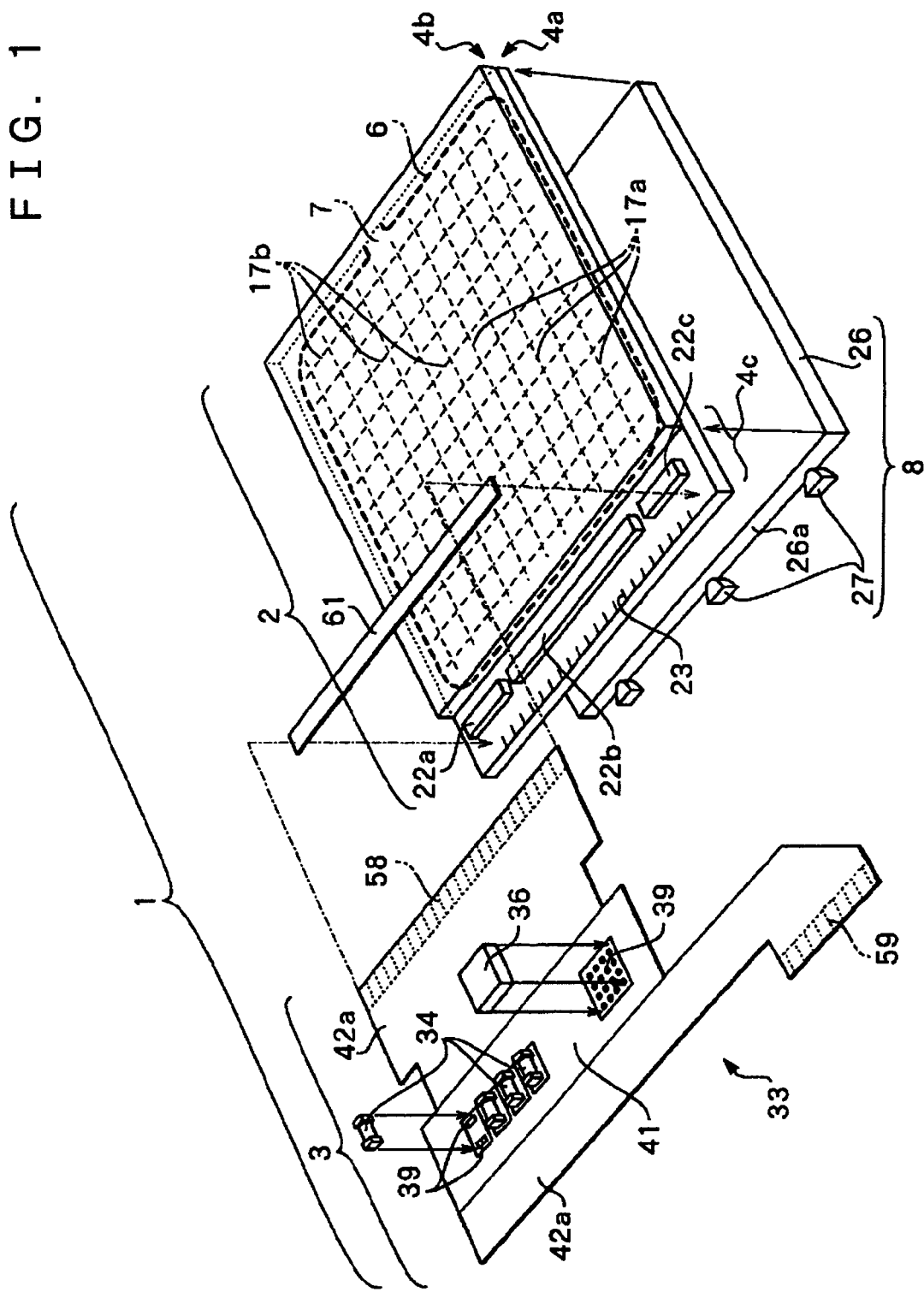
FIG. 1 is a perspective view showing an embodiment of a wiring board and an electrooptical apparatus according to the present invention.

In FIG. 1, reference numeral 3 indicates a wiring board according to an embodiment of the present invention. The wiring board 3 includes an FPC (Flexible Printed Circuit) 33 serving as a substrate, electronic parts 34 mounted on the FPC 33, and an IC package 36 serving as an IC assembly also mounted on the FPC 33. The IC package 36 can be a BGA (Ball Grid Array), CSP (Chip Sized Package), or the like.

As shown in FIG. 3, the FPC 33 is formed by forming various film elements on a flexible plastic base 37. Specifically, wiring lines 38a and terminals 39, which are made of, for example, Cu (copper), are formed on the mounting surface of the base 37 made of, for example, polyimide; a resist 41 is applied around the terminal 39; and a coverlayer 42a made of, for example, polyimide is formed in a region other than the region to which the resist 41 is applied.

A wiring line 38b made of, for example, Cu is formed on the rear surface of the base 37, and then over the entire surface a coverlayer 42b made of, for example, polyimide is formed, and a reinforcement film 43 made of, for example, polyimide is further formed in at least a region corresponding to the IC package 36.

In FIG. 1, the resist 41 is formed so that the terminals 39 are externally exposed at a region in which the IC package 36 and the electronic parts 34 are mounted. The coverlayer 42a is formed on the entire surface of the FPC 33 except for the region in which the resist 41 is formed. The coverlayer 42a and the resist 41 are not formed over a connection portion for a liquid crystal panel or a connection portion for a connector. As shown in FIG. 3(a), a portion 38bb of the wiring line 38b on the rear surface of the FPC 33 which corresponds to the IC package 36 is large enough to accommodate the entire IC package 36.

This portion 38bb, which is formed of copper film, functions as a characteristic-maintaining member for maintaining the characteristics of the IC package 36 in their normal state, and has specific functions as follows. Since Cu has a higher thermal conductivity than the polyimide of the base 37, the copper film portion 38bb causes heat generated in the IC package 36 to be externally dissipated. Furthermore, since Cu has a light-shielding property, the copper film portion 38bb prevents the IC package 36 from being exposed to light from the rear surface.

The copper film portion 38bb is larger than the IC package 36, and prevents the region of the FPC 33 corresponding to the IC package 36 from bending so as not to apply external force, such as shear or flexure, to the IC package 36. In FIG. 1, the reinforcement film 43 (see FIG. 3) formed in a region on the rear surface of the FPC 33 which corresponds to the area where the resist 41 is formed also prevents external force from being applied to the IC package 36. The thickness of the copper film portion 38bb is, for example, 30 □m or lower.

In FIG. 3, the wiring lines 38a on the front surface and the wiring lines 38b on the rear surface communicate with each other via through-holes 44 extending through the base 37. Thus, a complicated circuit can be configured by making use of both surfaces of the FPC 33. In particular, the through-holes 44 formed in the copper film portion 38bb on the region of the rear surface corresponding to the IC package 36 enhances the ability of the copper film portion 38bb to externally dissipate heat generated in the IC package 36.

Figure 4A:
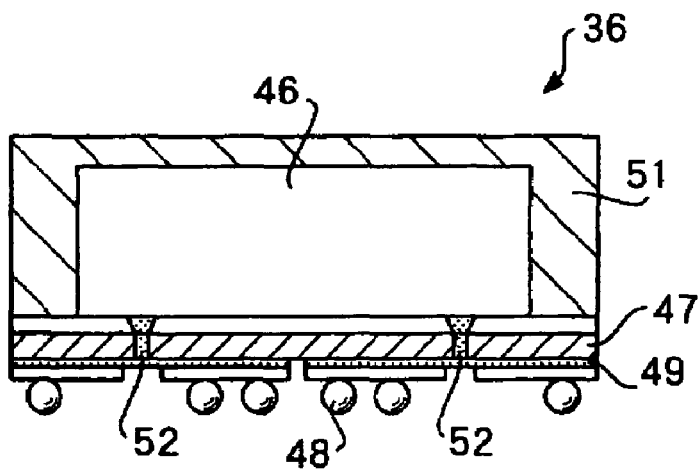
FIG. 4 includes diagrams showing some embodiments of an IC package employed in the present invention.

The IC package 36 is an IC package having a plurality of terminals formed on its bottom, or large-area, surface. Many variations may be made to the specific structure of the IC package 36. For example, as shown in FIG. 4(a), a sheet tape 49 supporting a plurality of solder balls 48 is bonded to an active surface of an IC chip 46 using an adhesive layer 47, and terminals (or pads) on the IC chip 46 and the solder balls 48 are electrically connected via through-holes 52, thereby forming the above structure. Reference numeral 51 denotes sealing resin.

If the adhesive layer 47 and the sheet tape 49 are transparent, the active surface of the IC chip 46 is exposed directly to external light.

Figure 4B:
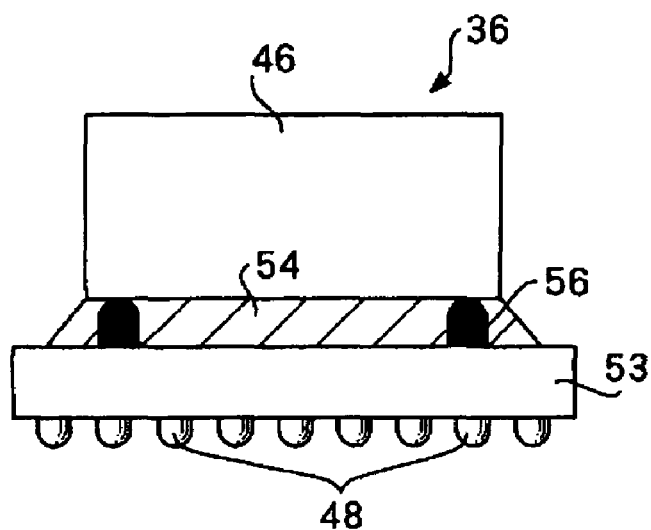

As shown in FIG. 4(b), the IC package 36 may also be formed by adhering a wiring plate 53 having a plurality of solder balls 48 to an active surface of the IC chip 46 through resin 54 to electrically connect pads of the IC chip 46 and the solder balls 48 via bumps 56.

Figure 4C:
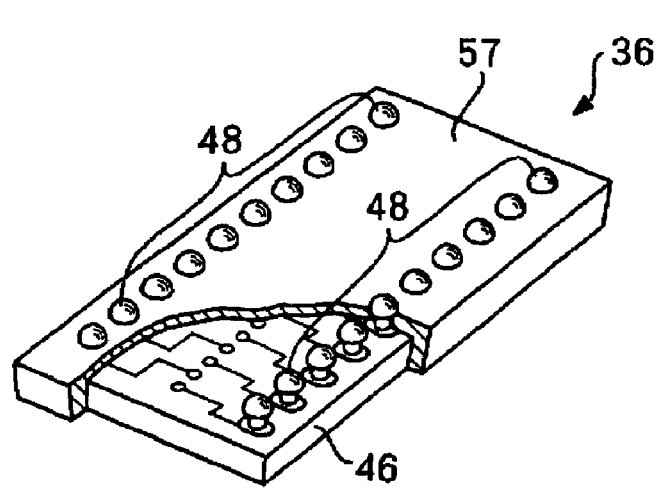

As shown in FIG. 4(c), the IC package 36 may also be formed by forming a plurality of solder balls 48 as solder bump terminals directly on pads of an IC chip 46 and coating the IC chip 46 with sealing resin 57 in such a manner that the solder balls 48 are exposed to the outside. If the sealing resin 57 is transparent, the active surface of the IC chip 46 is exposed directly to external light.

Figure 15A:
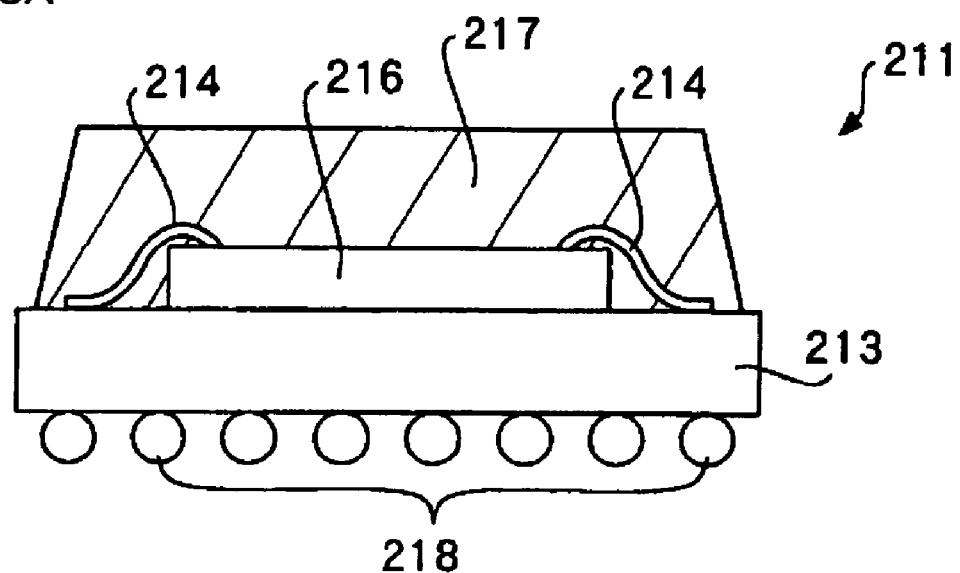
FIG. 15 includes diagrams showing other embodiments of an IC package employed in the present invention.
Figure 15B:
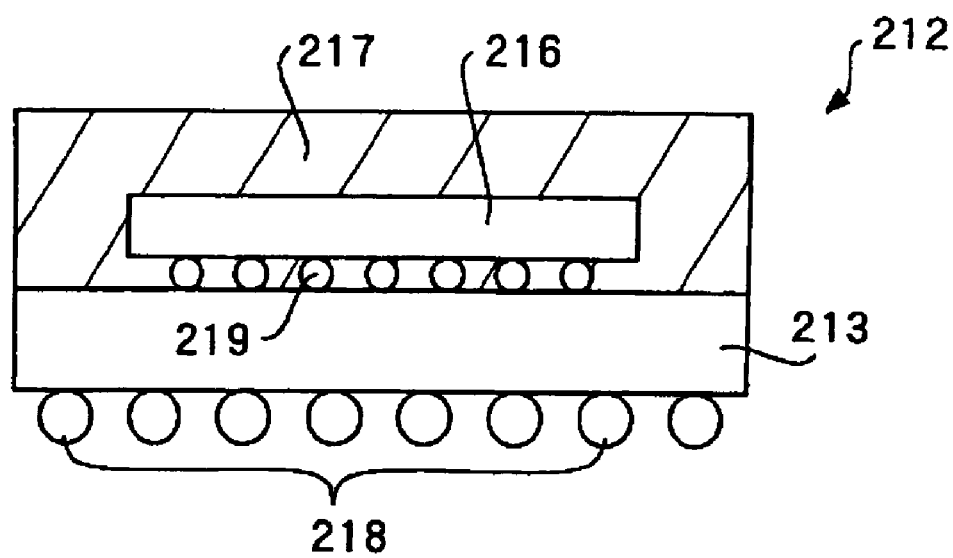
Figure 16:
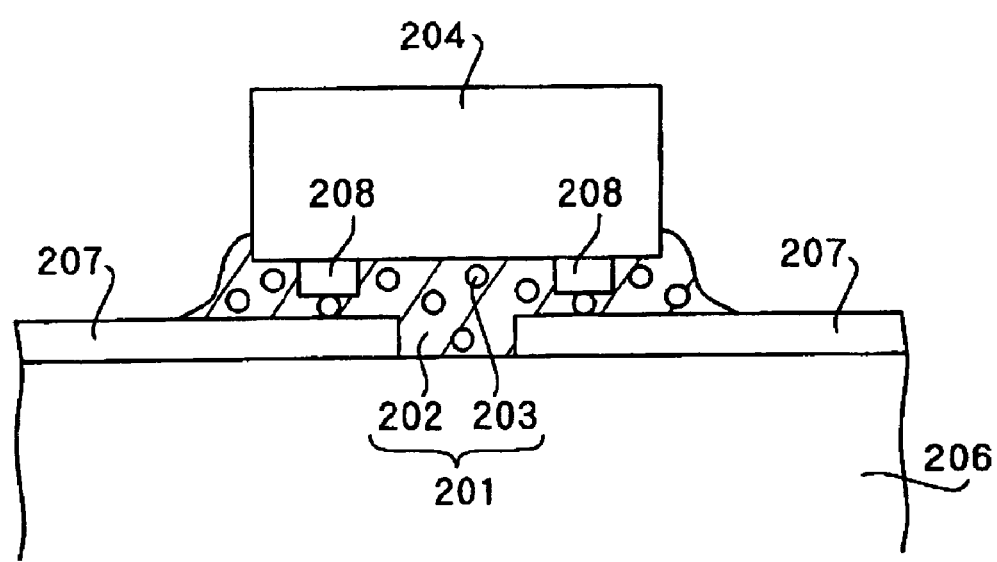
FIG. 16 is a cross-sectional view showing the cross section of the main portion of a wiring board of the related art.

The IC package 36 may also be in the form of the IC package 211 shown in FIG. 15(a) or the IC package 212 shown in FIG. 15(b).

The structure common to IC packages including the IC package 36 shown in FIGS. 4(a), 4(b), and 4(c), the IC package 211 shown in FIG. 15(a), and the IC package 212 shown in FIG. 15(b) is that terminals appear not on a side surface of the package but terminals, such as the solder balls 48, are formed on the bottom surface, that is, the large-area surface, of the package.

Embodiment of Wiring Board Production Method

Figure 5:
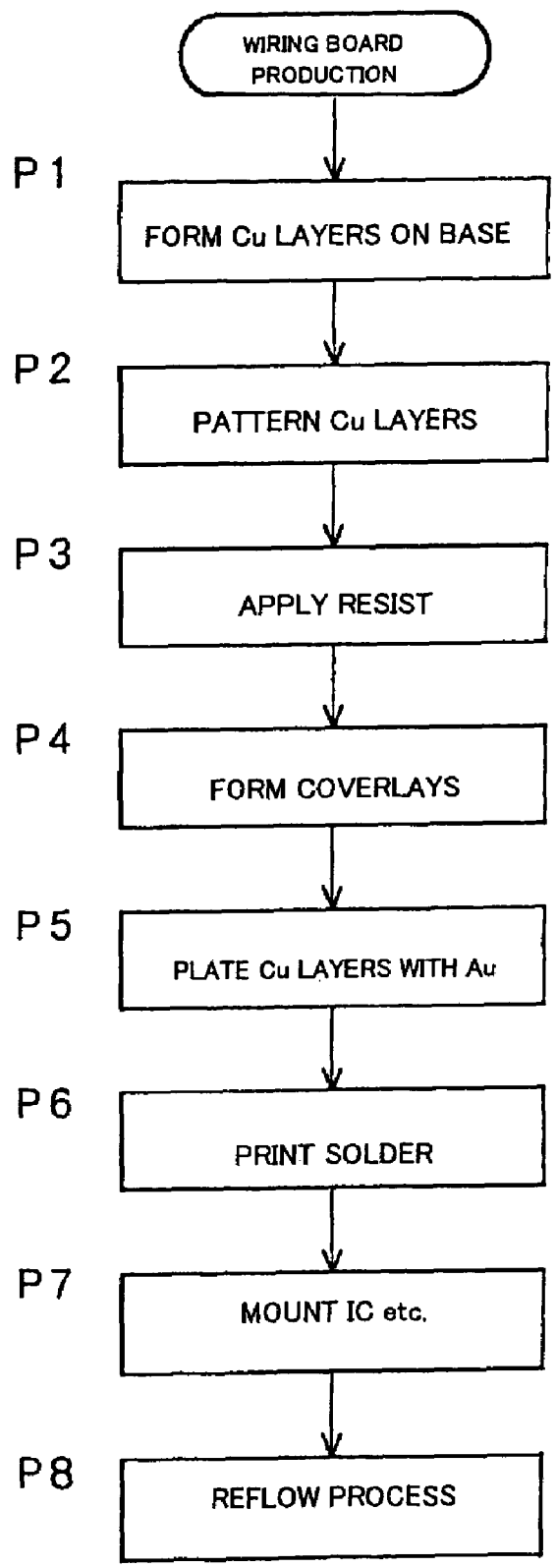
FIG. 5 is a process chart showing an embodiment of a wiring board production method according to the present invention.

The wiring board 3 shown in FIG. 1 can be produced by a production method shown in FIG. 5, by way of example. The following production method is merely an example for aiding the understanding of the present invention, and the present invention is not limited to this production method.

In step P1, Cu layers having a uniform thickness are formed on both surfaces of the base 37 shown in FIG. 3, and, in step P2, the Cu layers are patterned to form the wiring lines 38a and 38b on the front and rear surfaces, respectively. In step P3 shown in FIG. 5, the resist 41 is applied to a predetermined region of the FPC 33 shown in FIG. 1. Then, in step P4, the coverlayers 42a and 42b are formed in predetermined regions on both surfaces of the FPC 33 shown in FIG. 1. In step P5, the wiring lines 38a and 38b formed in step P2 shown in FIG. 5 are plated with Au (gold), if necessary.

In step P6 shown in FIG. 5, solder is printed on the FPC 33 shown in FIG. 1. Specifically, a metal mask is placed on the entirety or a desired region of the front surface of the FPC 33, and cream solder is applied to this mask by spreading it out over the mask using a squeegee. This mask has openings formed therein at portions on which solder is to be printed. The openings generally correspond to the terminals 39 on the FPC 33. When the solder is spread out over the mask using a squeegee, the solder is applied to the terminals 39 on the FPC 33 through the openings.

A soldering process with respect to a portion of the FPC 33 shown in FIG. 1 in which the IC package 36 is to be mounted is now described. The portion in which the IC package 36 is to be mounted is surrounded by the resist 41, as shown in FIG. 6(b). Within this region, 4×4, i.e., 16 terminals 39 corresponding to the terminals of the IC package 36, e.g., the solder balls 48 shown in FIG. 4(a), are formed in a matrix. The wiring lines 38a are connected to the terminals 39. In particular, each of the wiring lines 38a extending from the four terminals 39 in the inside region extends between two adjacent terminals among the terminals 39 in the outer frame region.

As shown in FIG. 6(a), a mask 62 for use in application of solder to the 16 terminals 39 has openings 63, each corresponding to one of the terminals 39 on the FPC 33. When the mask 62 is placed at a predetermined position on the FPC 33, the terminals 39 on the FPC 33 are exposed to the outside at the openings 63. In this embodiment, the openings 63 are larger than the terminals 39. When cream solder is placed on the mask 62 and is spread out using a squeegee, the solder is applied over the terminals 39 through the openings 63. As shown in FIG. 6(c), the solder 64 is supplied over the FPC 33 so as to coat the entirety of the terminals 39.

In a mounting method of the related art, solder is supplied to regions substantially the same as or smaller than the terminals 39, leading to a problem that a sufficient conduction area with respect to the terminals 39 cannot be ensured if the mask 62 is offset from the correct position on the FPC 33. According to this embodiment, in contrast, the solder 64 is printed on areas larger than the terminals 39, thus ensuring a sufficient contact area even if the mask 63 is offset from the correct position on the FPC 33.

In a case where a connection region, i.e., the wiring line 38a, is formed between two terminals 39, such as the terminals 39 in the outer frame region shown in FIG. 6(b), each opening 63 being larger than each terminal 39 may cause the connection region adjacent to the terminal 39, i.e., the wiring line 38a, to be coated with the solder 64 printed through the opening 63, as shown in FIG. 6(c).

In this situation, the terminal 39 and the wiring line 38a are short-circuited by the solder 64, and the resulting soldered construction is not suitable for practical use. In this embodiment, however, this solder printing step (step P6 shown in FIG. 5) is followed by a reflow process in step P8, in which the solder 64 is melted.

When the solder 64 is melted, under optimum reflow conditions, the melted solder 64 tends to move towards the closest metal member. As shown in FIG. 6(d), the solder 64 shown in FIG. 6(c), which is subjected to reflow, causes a portion 64a of the solder 64 to move towards the terminal 39 and the other portion 64b of the solder 64 to move towards the wiring line 38a. As a result, the solder 64 is divided into the two portions 64a and 64b. This eliminates the fear that the terminals 39 and the wiring lines 38a are short-circuited.

After the solder printing step P6 shown in FIG. 5, in step P7, the electronic parts 34 and the IC package 36 shown in FIG. 1 are mounted or placed on the FPC 33 in a predetermined position. In other words, the terminals of the electronic parts 34 are placed on the terminals 39, and the solder balls 48 of the IC package 36 are placed on the terminals 39.

Then, in step P8, the FPC 33 on which the electronic parts 34 and the IC package 36 are placed is heated within a reflow oven whose temperature increases to a predetermined temperature to melt the solder which carries the electronic parts 34 and the solder balls 48 of the IC package 36 for soldering. In producing the wiring board 3 according to this embodiment, therefore, both the electronic parts 34 and the IC package 36 can be soldered at the same time by one reflow process, thus achieving simple and low-cost production.

In FIG. 1, connection terminals 58 are formed at one edge of the FPC 33, and connection terminals 59 are formed at the other edge. The wiring board 3 is connected to an external electronic device or a control circuit via the connection terminals 58 and 59.

Modifications of Wiring Board

Although the wiring board 3 shown in FIG. 1 uses the flat FPC 33 shown, the FPC may have any other shape. Moreover, although the FPC is used as the substrate, an inflexible substrate, such as a glass substrate or an epoxy substrate, may also be used.

Figure 6:
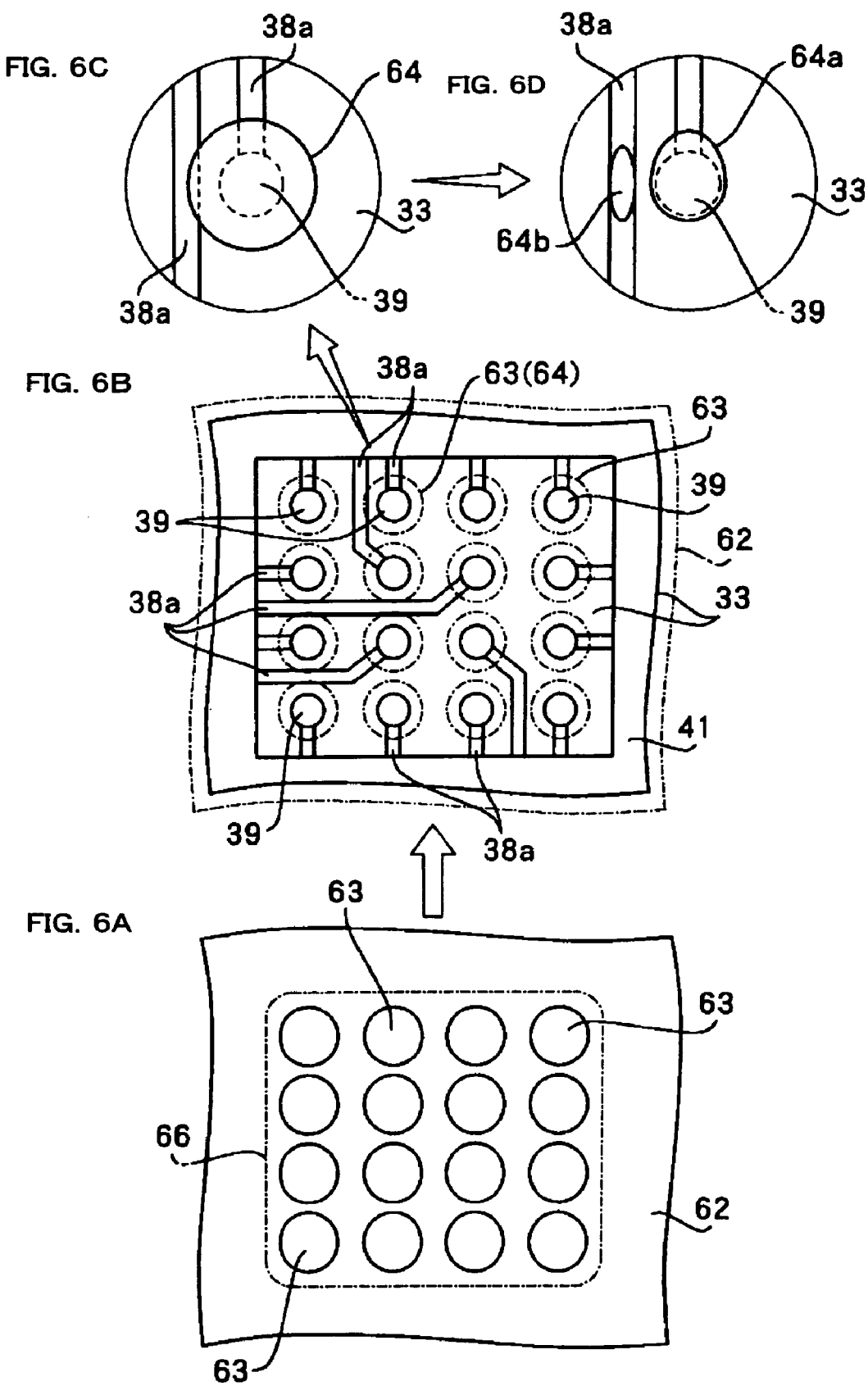
FIG. 6 includes diagrams showing one example of a mask according to the present invention and solder printed using the mask.

In the embodiment shown in FIG. 6, the wiring line 38a, which is a different conductive region, is formed between two adjacent terminals 39, by way of example. However, the present invention encompasses the case where a wiring line 38a is not formed between two adjacent terminals 39 and solder is printed between the two adjacent terminals 39 so that the terminals 39 become coated with the solder.

In the embodiment shown in FIG. 6(a), the openings 63 in the mask 62 are formed in a matrix. However, alternatively, a single large rectangular or square opening 66 including all the openings 63 may be formed, and solder may be supplied therethrough to the entirety of a region including all the terminals 39.

Embodiment of Electrooptical Apparatus

An embodiment of an electrooptical apparatus according to the present invention is described below in the context of a liquid crystal apparatus. The following embodiment is merely an example for aiding the understanding of the present invention, and the present invention is not limited to this embodiment.

In FIG. 1, a liquid crystal apparatus 1 as an electrooptical apparatus includes a liquid crystal panel 2 and a wiring board 3. The wiring board 3 may use a wiring board of the above-described structure. When a lighting device is necessary in addition to external light such as solar light or room light, the liquid crystal apparatus 1 includes a lighting device 8. In the embodiment shown in FIG. 1, an image is displayed on the top surface of the liquid crystal panel 2, and the lighting device 8 functions as a backlight for supplying light from the side opposite the observation side.

The liquid crystal panel 2 may use any type of liquid crystal panel, such as a simple-matrix liquid crystal panel having no switching device, an active-matrix liquid crystal panel having a two-terminal switching device, such as a TFD (Thin Film Diode), or an active-matrix liquid crystal panel having a three-terminal switching device, such as a TFT (Thin Film Transistor). Assuming herein that a simple-matrix liquid crystal panel is employed as a liquid crystal panel, the liquid crystal panel 2 has the following structure.

The liquid crystal panel 2 includes a first substrate 4a and a second substrate 4b facing the first substrate. On a surface of one of the substrates 4a and 4b, a sealing material 6 is formed into substantially a rectangular frame shape using a technique such as printing. The first substrate 4a and the second substrate 4b are bonded by the sealing material 6. A port 7 is left on a portion of the sealing material 6 for liquid crystal injection.

In FIG. 2, when the first substrate 4a and the second substrate 4b are bonded by the sealing material 6, a gap having a predetermined height, referred to as a cell gap, is formed between these substrates, into which a liquid crystal 9 is injected through the port 7 (see FIG. 1). When the liquid crystal 9 is completely injected into the cell gap, the port 7 is filled and sealed with resin or the like. The cell gap having the encapsulated liquid crystal 9 is typically maintained at a desired size by a plurality of spherical spacers 11 distributed onto a surface of the first substrate 4a or the second substrate 4b.

The first substrate 4a has a base member 12a made of glass, plastic, or the like, and a semi-transparent reflection film 13 made of, for example, Al (aluminum), is formed on the surface of the base member 12a toward the liquid crystal 9. The semi-transparent reflection film 13 has a matrix of openings 14 for light transmission corresponding to display dots, which are the minimum units comprising the display. The openings 14 can be formed using, for example, photolithography and etching.

An insulation film 16 is formed on the semi-transparent reflection film 13 using a well-known deposition technique, such as spin coating. A first electrode 17a made of, for example, ITO (Indium Tin Oxide) is formed on the insulation film 16 using photolithography. In the first electrode 17a, a plurality of line electrodes are arranged in parallel to each other in the manner shown in FIG. 1 to form a stripe pattern, as viewed from the direction indicated by the arrow D in FIG. 2. In FIG. 1, for easy understanding of the arrangement of the first electrode 17a, the pitch between the line electrodes is larger than actual. Actually, many of the first electrodes 17a are formed on the base member 12a with a smaller pitch therebetween.

In FIG. 2, on the first electrode 17a, an alignment film 18a made of, for example, polyimide is formed as a film of uniform thickness using a technique such as printing. The alignment film 18a is subjected to alignment, e.g., rubbing, to determine the orientation of the liquid crystal 9 on the substrate 4a side. A polarizer 19a is attached to an outer surface of the base member 12a by, for example, an adhesive. A phase contrast plate is provided between the polarizer 19a and the base member 12a, if necessary.

The second substrate 4b opposing the first substrate 4a has a base member 12b made of glass, plastic, or the like, and a color filter 21 is formed on the surface of the base member 12a toward the liquid crystal 9 by a technique such as pigment dispersion or ink-jet printing. The color filter 21 is formed by, for example, arranging three primary colors of R (red), G (green), and B (blue) or three primary colors of C (cyan), M (magenta), and Y (yellow) into a predetermined pattern, such as a stripe, a delta, or a mosaic pattern, as viewed from the direction indicated by arrow D. Each color element of the color filter 21 corresponds to each display dot which is the minimum unit from which a displayed image is composed. Three color elements corresponding to R, G, and B or C, M, and Y form one unit, thereby forming one pixel.

A second electrode 17b made of, for example, ITO is formed on the color filter 21 using a technique such as photolithography. In the second electrode 17b, a plurality of line electrodes extending orthogonally to the first electrode 17a are arranged in parallel to each other in the manner shown in FIG. 1 to form a stripe pattern, as viewed from the direction indicated by the arrow D in FIG. 2. In FIG. 1, for easy understanding of the arrangement of the second electrode 17b, the pitch between the line electrodes is larger than actual. Actually, many second electrodes 17b are formed on the base member 12b with a smaller pitch therebetween.

On the second electrodes 17b, an alignment film 18b made of, for example, polyimide is formed as a film of uniform thickness using a technique such as printing. The alignment film 18b is subjected to alignment, e.g., rubbing, to determine the orientation of the liquid crystal 9 on the substrate 4b side. A polarizer 19b is attached to an outer surface of the base member 12b by, for example, an adhesive. The polarizing axis of the polarizer 19b is set at a different angle from the polarizer 19a of the first substrate 4a.

In FIG. 1, the first substrate 4a has an extending portion 4c which extends beyond the second substrate 4b, and driving ICs 22a, 22b, and 22c are mounted on the extending portion 4c using, for example, ACFs (Anisotropic Conductive Films). In other words, this embodiment employs a COG (Chip On Glass) mounting method in which driving ICs are mounted directly on a substrate of a liquid crystal panel. The input terminals of these IC chips are connected to external connection terminals 23 on an edge of the extending portion 4c of the first substrate 4a.

The output terminal of the driving IC 22b at the center of the extending portion 4c is connected directly to the first electrode 17a formed on the first substrate 4a. Thus, the driving IC 22b drives the first electrode 17a. As shown in FIG. 2, the sealing material 6 has a plurality of spherical or cylindrical conduction materials 24 dispersed within. The driving ICs 22a and 22c mounted on both sides of the extending portion 4c, as shown in FIG. 1, are connected to the second electrode 17b formed on the second substrate 4b via the conduction materials 24. Thus, the driving ICs 22a and 22c drive the second electrode 17b.

In FIG. 1, the lighting device 8 includes a light guide 26 made of plastic or the like, and LEDs (Light Emitting Diodes) 27 serving as light sources located on the face 26a of the light guide 26 which takes in light. As shown in FIG. 2, each of the LEDs 27 is supported by an LED substrate 28 and is placed in position. A diffusion sheet 29 is attached to a surface of the light guide 26 toward the liquid crystal panel 2, that is, a light emitting face 26b, by, for example, an adhesive. A reflection sheet 31 is further attached to the surface of the light guide 26 opposite the liquid crystal panel 2 by, for example, an adhesive. The lighting device 8 is attached to the liquid crystal panel 2 via a buffer member 32.

In the liquid crystal panel 2 of the above-described structure, when the light from the outer side of the second substrate 4b, or the observation side in FIG. 2, is strong, the light is transmitted through the second substrate 4b and the liquid crystal 9, and is reflected by the semi-transparent reflection film 13 to return to the liquid crystal 9. Meanwhile, the driving ICs 22a, 22b, and 22c shown in FIG. 1 control a voltage applied between the first electrode 17a and the second electrode 17b for every display dot to control the orientation of the liquid crystal 9 for every display dot. The light reflected by the semi-transparent reflection film 13 to enter the layer of the liquid crystal 9 is modulated according to the orientation of the liquid crystal 9, and the modulated light is selectively transmitted through the polarizer 19b, thereby displaying a desirable image on the observation side. In this embodiment, the color filter 21 is located on the light path, thus causing a color image to be displayed. Therefore, reflection type display is realized.

On the other hand, when the light from the observation side is weak, the LEDs 27 are lit. The dotted or linear light emitted from the LEDs 27 is guided from the light incident face 26a of the light guide 26 to the inside of the light guide 26, propagates in the light guide 26, and is emitted from the light outgoing face 26b. The emitted light is transmitted through the first substrate 4a, and enters the layer of the liquid crystal 9 through the openings 14 in the semi-transparent reflection film 13. The light is then modulated according to the orientation of the liquid crystal 9, thus allowing an image to be externally displayed in the same manner as the reflection type. Therefore, transmission type display is realized.

In FIG. 1, the connection terminals 58 are formed at the edge of the FPC 33 toward the liquid crystal panel 2, and the connection terminals 59 are formed at the other edge. The edge of the FPC 33 on which the connection terminals 58 are formed is bonded to the edge of the extending portion 4c of the first substrate 4a using an ACF 61 by thermal compression. The ACF 61 is formed of multiple conductive particles dispersed in thermoplastic, thermosetting, or ultraviolet-curing resin. The first substrate 4a and the FPC 33 are adhered to each other by the resin forming the ACF 61, and the terminals 58 on the FPC 33 and the terminals 23 on the first substrate 4a are electrically connected with each other via the conductive particles in the ACF 61.

The connection terminals 59 of the wiring board 3 are connected to an external control circuit (not shown), e.g., a control circuit contained in an electronic device, such as a cellular telephone or a portable information terminal device. When a signal is supplied from the external control circuit to the wiring board 3 through the terminals 59, the electronic parts 34 and the IC package 36 carry out predetermined functions, so that predetermined signals are supplied to the driving ICs 22a, 22b, and 22c so as to drive the aforementioned display operation of the liquid crystal panel 2.

Embodiment of Electrooptical Apparatus Production Method

Figure 7:
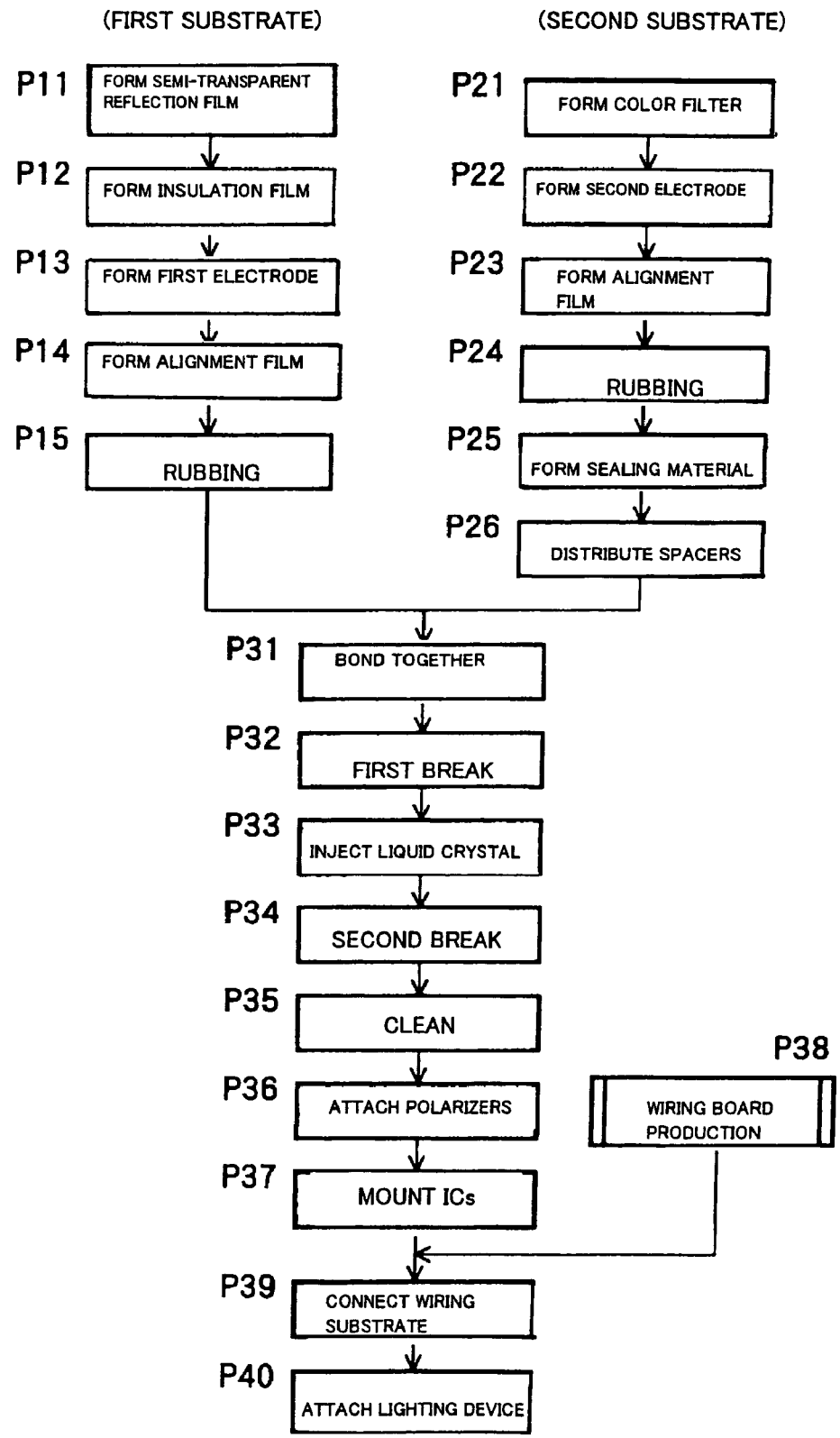
FIG. 7 is a process chart showing an embodiment of an electrooptical apparatus production method according to the present invention.

The liquid crystal apparatus 1 shown in FIG. 1 can be produced by, for example, a production method shown in FIG. 7. The following production method is merely an example for aiding the understanding of the present invention, and the present invention is not limited to this production method.

In FIG. 7, a series of operations shown in steps P11 through P15 is a process for fabricating the first substrate 4a shown in FIG. 2. A series of operations shown in steps P21 through P26 is a process for fabricating the second substrate 4b shown in FIG. 2.

Figure 8A:
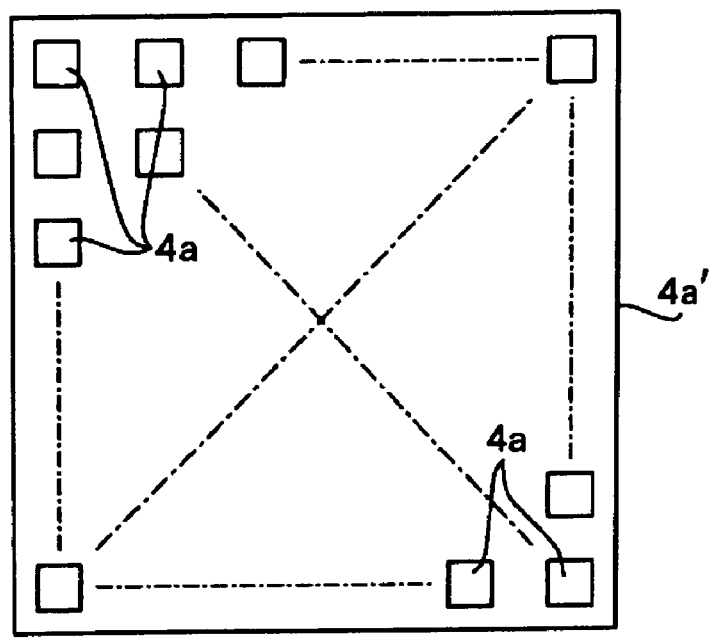
FIG. 8 is a plan view of a mother substrate for use in the production method shown in FIG. 7.
Figure 8B:
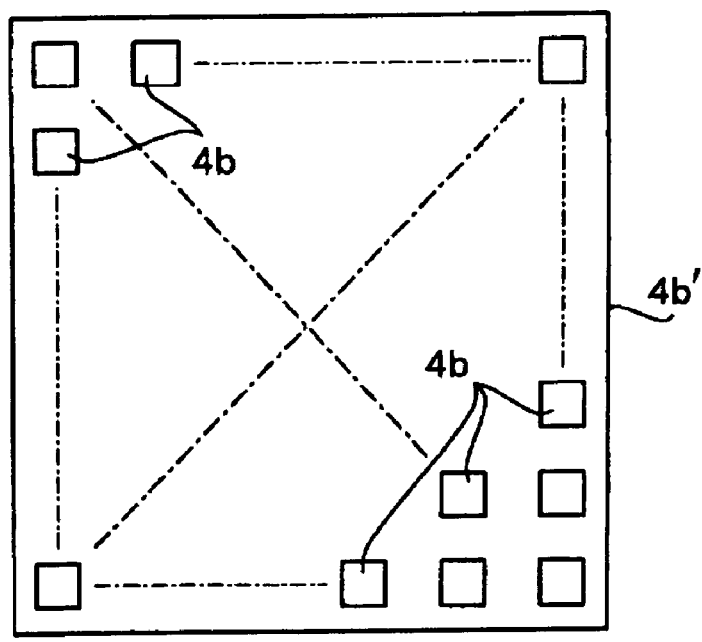

In this embodiment, both the first substrate 4a and the second substrate 4b shown in FIG. 2 are produced not one-by-one but rather, as shown in FIG. 8(a), a liquid crystal panel pattern corresponding to a plurality of first substrates 4a is formed on a large mother base 4a' having an area large enough to accommodate a plurality of first substrates 4a. As shown in FIG. 8(b), a liquid crystal panel pattern corresponding to a plurality of second substrates 4b is formed on a large mother base 4b'.

First, in step P11 shown in FIG. 7, the semi-transparent reflection film 13 (see FIG. 2) made of, for example, aluminum, aluminum alloy, or silver alloy, is formed on a surface of the mother base 4a' shown in FIG. 8(a) by a patterning method using, for example, photolithography. At this time, the opening 14 corresponding to each display dot region is formed. Then, in step P12, the insulation film 16 is formed using a well-known deposition technique, such as spin coating.

Then, in step P13 shown in FIG. 7, the first electrode 17a shown in FIG. 2, made of, for example, ITO, is formed by a well-known patterning method such as photolithography, followed by etching. In step P14, the alignment film 18a shown in FIG. 2 is formed by applying film material such as polyimide and firing it. In step P15, the alignment film 18a is subjected to alignment, such as rubbing, to determine the liquid crystal orientation. A pattern for a plurality of first substrates 4a shown in FIG. 2 is thus formed on the mother base 4a' shown in FIG. 8(a).

On the other hand, in step P21 shown in FIG. 7, the color filter 21 shown in FIG. 2 is formed into a predetermined pattern on a surface of the mother base 4b' shown in FIG. 8(b) by pigment dispersion, ink-jet printing, or another technique as preferred. In step P22, the second electrode 17b shown in FIG. 2, made of, for example, ITO, is formed by a well-known patterning method such as photolithography, followed by etching. In step P23, the alignment film 18b shown in FIG. 2 is formed by applying and firing a film material such as polyimide. In step P24, the alignment film 18b is subjected to alignment, such as rubbing, to determine the liquid crystal orientation.

Then, in step P25, the sealing material 6 shown in FIG. 2 is formed on the surface of the mother base 4b' using a technique such as printing, and, in step P26, the spacers 11 shown in FIG. 2 are distributed. Therefore, a pattern for a plurality of second substrates 4b shown in FIG. 2 is formed on the mother base 4b' shown in FIG. 8(b).

When the mother base 4a' having the plurality of first substrates 4a and the mother base 4b' having the plurality of second substrates 4b are formed, in step P31 the mother bases 4a' and 4b' are bonded by the sealing material 6 sandwiched therebetween. Therefore, a large panel assembly containing a plurality of the liquid crystal panels 2 shown in FIG. 2 is formed.

Then, in step P32, a first cutting process, or a first breaking process, is performed on the large panel assembly, thereby forming elongated or strip panel assemblies, in which the liquid crystal injection port 7 (see FIG. 1) of each liquid crystal panel portion is exposed. A liquid crystal is injected into each liquid crystal panel portion of the strip panel assemblies through the exposed liquid crystal injection port 7, and the liquid crystal injection port 7 is sealed with resin or the like.

Then, in step 34, a second cutting process, or a second breaking process, is performed on the strip panel assemblies having the encapsulated liquid crystal to divide the liquid crystal panels 2 shown in FIG. 1 into pieces.

The divided liquid crystal panels 2 are cleaned in step P35 to remove any unnecessary liquid crystal, etc., and then in step P36, the polarizers 19a and 19b are attached by, for example, an adhesive. In step P37, the driving ICs 22a, 22b, and 22c shown in FIG. 1 are mounted on the extending portion 4c of the first substrate 4a, after which the lighting device 8 is attached to the liquid crystal panel 2.

Separately from the above-described liquid crystal panel production process, in step P38, a wiring board production process is carried out. This is implemented by, for example, the series of steps shown in FIG. 5. In the wiring board production process P38, the wiring board 3 shown in FIG. 1 is produced. After the wiring board 3 is produced, in step P39 shown in FIG. 7, the wiring board 3 is connected to the edge of the extending portion 4c of the first substrate 4a using the ACF 61, as shown in FIG. 1. In step P40, the lighting device 8 shown in FIG. 1 is attached to the liquid crystal panel 2. The liquid crystal apparatus 1 shown in FIG. 1 is thus constructed.

The liquid crystal apparatus 1 of this embodiment has the wiring board 3 formed by the production method shown in FIG. 5. Specifically, the wiring board 3 is formed by a production method having a solder printing process using the mask 62 which has the large openings 63 or 66 shown in FIG. 6(a). Therefore, the IC package 36 can be mounted on the wiring board 3 with high reliability, thus maintaining the desirable IC characteristics for a long time.

Modifications

In the foregoing description, a simple-matrix liquid crystal apparatus having no switching device is shown, by way of example; however, the present invention is also applicable to an active-matrix liquid crystal apparatus having a two-terminal switching device attached to each display dot, or an active-matrix liquid crystal apparatus having a three-terminal switching device attached to each display dot.

The present invention is also applicable to any electrooptical apparatus other than a liquid crystal apparatus, such as an EL apparatus using an organic EL (Electro Luminescence) as an electrooptical material, a plasma apparatus using lean gas as electrooptical material and using plasma discharge generated in the gas, an inorganic EL apparatus, an electrophoretic display apparatus, or a field-emission display apparatus.

Embodiments of Electronic Device

An electronic device according to the present invention is described below in conjunction with embodiments thereof. These embodiments are merely examples of the present invention, and the present invention is not limited to these embodiments.

Figure 9:
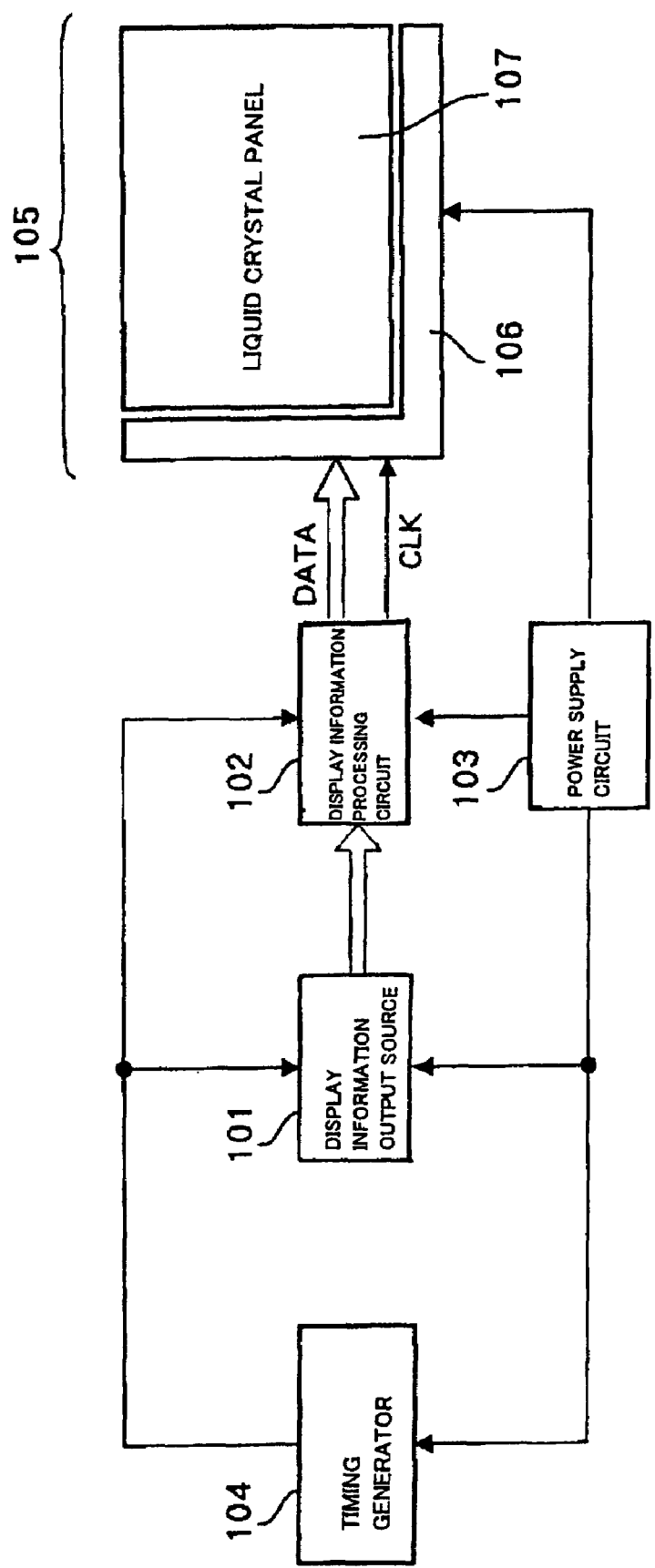
FIG. 9 is a block diagram showing an embodiment of an electronic device according to the present invention.

FIG. 9 illustrates an embodiment of the electronic device according to the present invention. The illustrated electronic device is formed of a display information output source 101, a display information processing circuit 102, a power supply circuit 103, a timing generator 104, and a liquid crystal apparatus 105. The liquid crystal apparatus 105 includes a liquid crystal panel 107 and a driving circuit 106.

The display information output source 101 includes a memory including a RAM (Random Access Memory), a storage unit including various disks, a tuning circuit for outputting a tuned digital image signal, and so on, and supplies display information, including image signals in predetermined formats, to the display information processing circuit 102 based on various clock signals generated by the timing generator 104.

The display information processing circuit 102 includes multiple well-known circuits including an amplifier/inverter circuit, a rotation circuit, a gamma correction circuit, and a clamp circuit, and processes the input display information to supply the image signals to the driving circuit 106 together with a clock signal CLK. The driving circuit 106 comprehensively refers to a scanning line driving circuit (not shown), a data line driving circuit (not shown), a testing circuit, etc. The power supply circuit 103 supplies a predetermined power voltage to the above-noted components.

The liquid crystal apparatus 105 has a similar structure to, for example, the structure of the liquid crystal apparatus 1 shown in FIG. 1. The liquid crystal apparatus 105 can be produced by, for example, the production method shown in FIG. 7. The wiring board 3 shown in FIG. 1 of the liquid crystal apparatus 1 can be produced by, for example, the production method shown in FIG. 5. The openings 63 in the mask 62 shown in FIG. 6(a) for use in the solder printing step P6 of the production method shown in FIG. 5 are larger than the terminals 39 on the FPC 33, and the solder printed on the substrate 33 through the openings 63 ensures a sufficient contact area with respect to the terminals 39.

Figure 10:
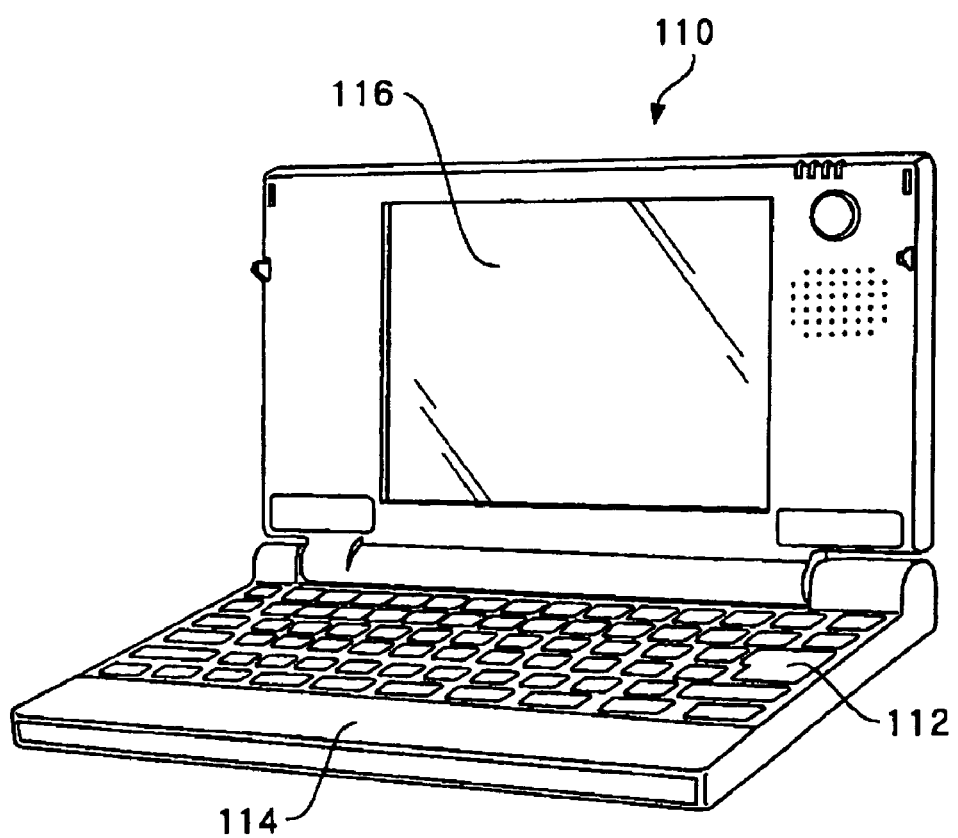
FIG. 10 is a perspective view showing another embodiment of the electronic device according to the present invention.

FIG. 10 illustrates a mobile personal computer as another embodiment of the electronic device according to the present invention. The illustrated personal computer 110 is formed of a main body 114 having a keyboard 112, and a liquid crystal display unit 116.

The liquid crystal display unit 116 can be constructed using, for example, the liquid crystal apparatus 1 shown in FIG. 1 as a display. The liquid crystal apparatus 1 can be produced by, for example, the production method shown in FIG. 7. The wiring board 3 shown in FIG. 1 of the liquid crystal apparatus 1 can be produced by, for example, the production method shown in FIG. 5. The openings 63 in the mask 62 shown in FIG. 6(*a*) for use in the solder printing step P6 of the production method shown in FIG. 5 are larger than the terminals 39 on the FPC 33, and the solder printed on the substrate 33 through the openings 63 ensures a sufficient contact area with respect to the terminals 39.

Figure 11:
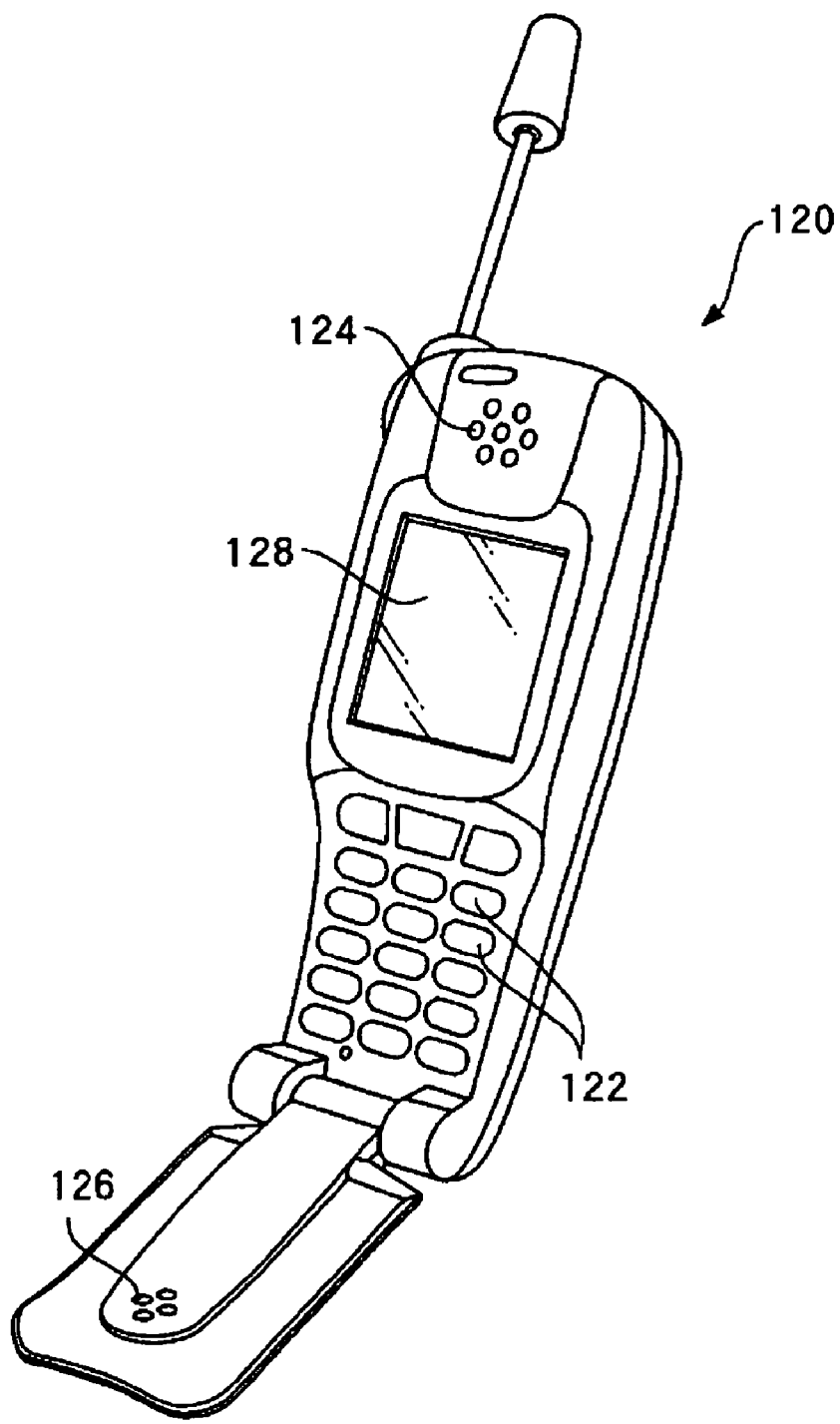
FIG. 11 is a perspective view showing still another embodiment of the electronic device according to the present invention.

FIG. 11 illustrates a cellular telephone as still another embodiment of the electronic device according to the present invention. The illustrated cellular telephone 120 includes a plurality of operation buttons 122, an earpiece 124, a mouthpiece 126, and a liquid crystal display unit 128. The liquid crystal display unit 128 can be constructed using, for example, the liquid crystal apparatus 1 shown in FIG. 1. The liquid crystal apparatus 1 can be produced by, for example, the production method shown in FIG. 7. The wiring board 3 shown in FIG. 1 of the liquid crystal apparatus 1 can be produced by, for example, the production method shown in FIG. 5. The openings 63 in the mask 62 shown in FIG. 6(*a*) for use in the solder printing step P6 of the production method shown in FIG. 5 are larger than the terminals 39 on the FPC 33, and the solder printed on the substrate 33 through the openings 63 ensures a sufficient contact area with respect to the terminals 39.

Figure 12:
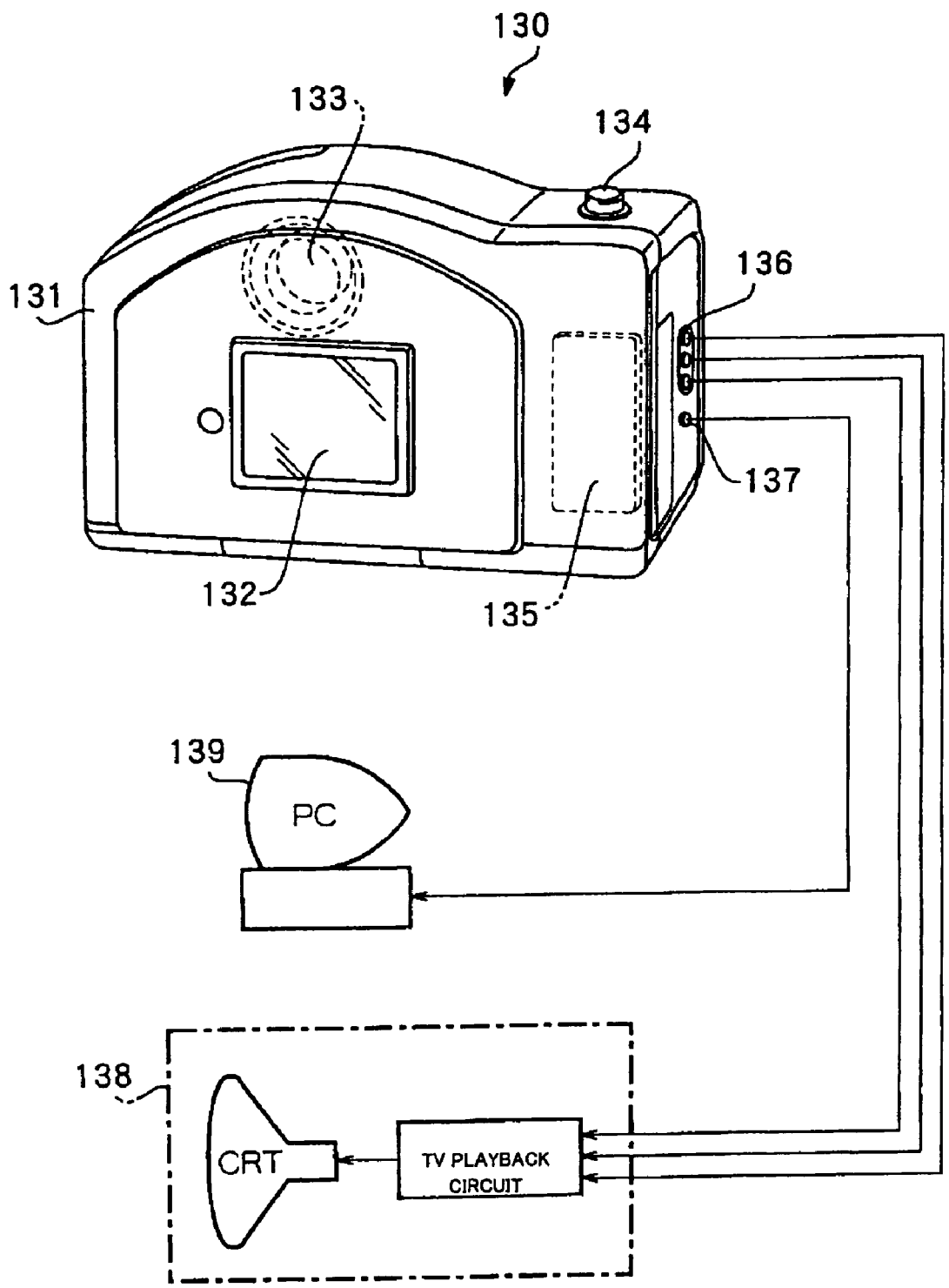
FIG. 12 is a perspective view showing still another embodiment of the electronic device according to the present invention.

FIG. 12 illustrates a digital still camera as still another embodiment of the electronic device according to the present invention, which uses a liquid crystal apparatus as a finder. While a typical camera creates an optical image of an object by causing film to be exposed to light, a digital still camera 130 photoelectrically converts an optical image of an object using an imaging device such as a CCD (Charge Coupled Device) to generate an imaging signal.

A liquid crystal display unit 132 is provided on the rear surface of a case 131 of the digital still camera 130, to do display based on an imaging signal generated by the CCD. The liquid crystal display unit 132 functions as a finder for displaying the object.

A light-receiving unit 133 including an optical lens, a CCD, etc., is provided on the front side (backside as viewed in FIG. 12) of the case 131. When a photographer presses a shutter button 134 while viewing an object image displayed on the liquid crystal display unit 132, an imaging signal of the CCD at this time is transferred to and stored in a memory on a circuit board 135.

A video signal output terminal 136 and a data communication input/output terminal 137 are provided on a side surface of the case 131. A TV monitor 138 is connected to the video signal output terminal 136, if necessary, and a personal computer 139 is connected to the data communication input/output terminal 137, if necessary. The imaging signal stored in the memory on the circuit board 135 is output to the TV monitor 138 or the personal computer 139 depending upon the predetermined operation.

The liquid crystal display unit 132 can be constructed using, for example, the liquid crystal apparatus 1 shown in FIG. 1. The liquid crystal apparatus 1 can be produced by, for example, the production method shown in FIG. 7. The wiring board 3 shown in FIG. 1 of the liquid crystal apparatus 1 can be produced by, for example, the production method shown in FIG. 5. The openings 63 in the mask 62 shown in FIG. 6(*a*) for use in the solder printing step P6 of the production method shown in FIG. 5 are larger than the terminals 39 on the FPC 33, and the solder printed on the substrate 33 through the openings 63 ensures a sufficient contact area with respect to the terminals 39.

Figure 13:
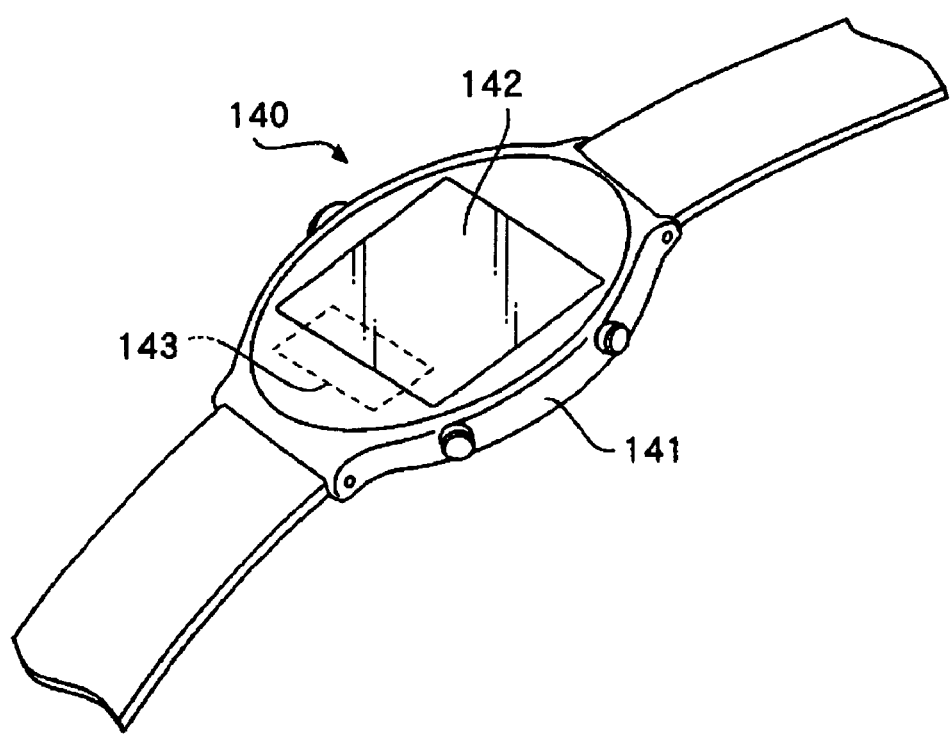
FIG. 13 is a perspective view showing still another embodiment of the electronic device according to the present invention.

FIG. 13 illustrates a watch-type electronic device as still another embodiment of the electronic device according to the present invention. The illustrated watch-type electronic device 140 includes a liquid crystal display unit 142 as a display supported by a watch body 141, and the liquid crystal display unit 142 is controlled by an internal control circuit 143 of the watch body 141 to display information including time and date.

The liquid crystal display unit 142 can be constructed using, for example, the liquid crystal apparatus 1 shown in FIG. 1. The liquid crystal apparatus 1 can be produced by, for example, the production method shown in FIG. 7. The wiring board 3 shown in FIG. 1 of the liquid crystal apparatus 1 can be produced by, for example, the production method shown in FIG. 5. The openings 63 in the mask 62 shown in FIG. 6(*a*) for use in the solder printing step P6 of the production method shown in FIG. 5 are larger than the terminals 39 on the FPC 33, and the solder printed on the substrate 33 through the openings 63 ensures a sufficient contact area with respect to the terminals 39.

Figure 14:
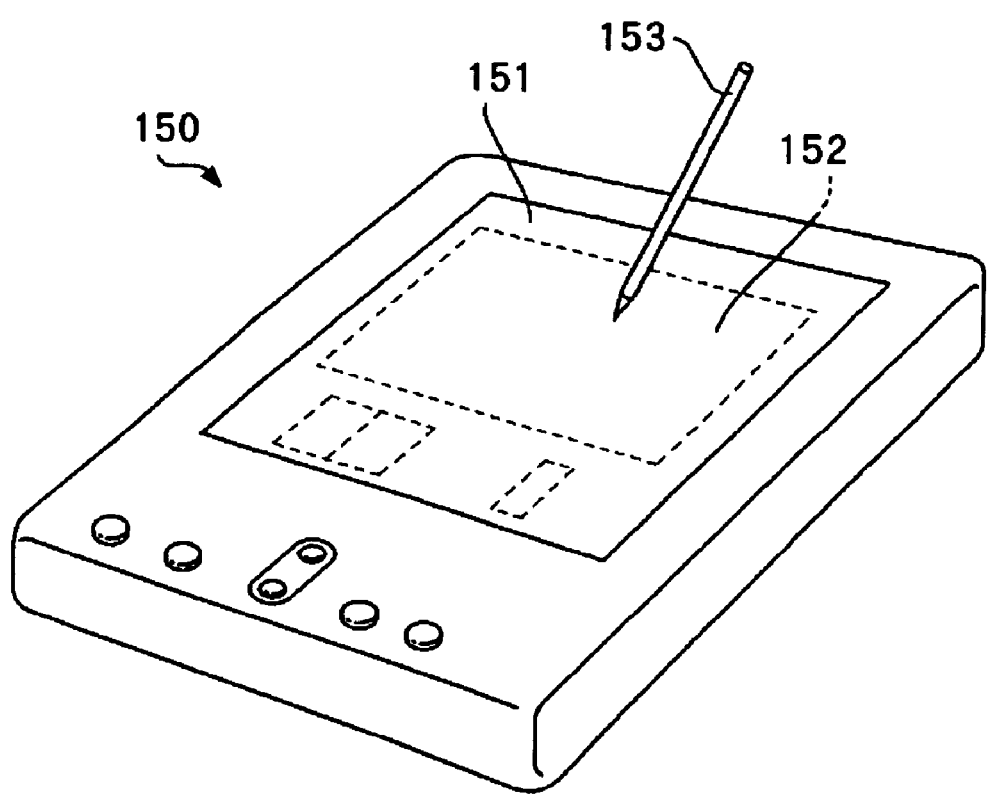
FIG. 14 is a perspective view showing still another embodiment of the electronic device according to the present invention.

FIG. 14 illustrates a PDA (Personal Digital Assistant), which is a portable information terminal device as still another embodiment of the electronic device according to the present invention. The illustrated PDA 150 includes a contact-type, or so-called touch-panel, input device 151 on a front panel thereof. The input device 151 is transparent, and a liquid crystal apparatus 152 serving as a display is provided below the input device 151.

A user brings an attached pen input tool 153 into contact with an input plane of the input device 151 to select a button or any other item displayed on the liquid crystal apparatus 152 or to plot characters, figures, etc., to input necessary information. The input information is subjected to predetermined calculation by an internal computer of the PDA 150, and the result is displayed on the liquid crystal apparatus 152.

The liquid crystal apparatus 152 can be constructed using, for example, the liquid crystal apparatus 1 shown in FIG. 1. The liquid crystal apparatus 1 can be produced by, for example, the production method shown in FIG. 7. The wiring board 3 shown in FIG. 1 of the liquid crystal apparatus 1 can be produced by, for example, the production method shown in FIG. 5. The openings 63 in the mask 62 shown in FIG. 6(*a*) for use in the solder printing step P6 of the production method shown in FIG. 5 are larger than the terminals 39 on the FPC 33, and the solder printed on the substrate 33 through the openings 63 ensures a sufficient contact area with respect to the terminals 39.

Modifications

The electronic device may be, besides the above-described personal computer, cellular telephone, digital still camera, watch-type electronic device, or PDA mentioned above, a liquid crystal television set, a video tape recorder of the viewfinder type or monitor direct vision type, a car navigation system, a pager, an electronic organizer, an electronic calculator, a word processor, a workstation, a TV telephone, a POS terminal unit, or the like.

Advantages

According to the present invention, the solder applied to a substrate, such as an FPC, through openings in a mask are larger than terminals on the substrate, thus ensuring a sufficient contact area between the terminals on the substrate and the solder applied thereto even if the mask is offset from the correct position on the substrate.

The entire disclosure of Japanese Patent Application No. 2002-275177 filed Sep. 20, 2002 is incorporated by reference.

What is claimed is:

1. A wiring board production method comprising:
   forming a pair of substrate terminals on a substrate;
   forming a conductive region between the pair of substrate terminals;
   applying solder continuously across one of the substrate terminals and the conductive region to entirely cover one of the substrate terminals and at least partially cover a portion of the conductive region;
   mounting an IC package, which has terminals and solder balls connected to the terminals, on the substrate so that the solder balls of the IC package are aligned with corresponding substrate terminals through the applied solder;
   melting the applied solder and the solder balls in a reflow process after mounting the IC package; and
   performing the reflow process so as to divide the applied solder between the one substrate terminal and the portion of the conductive region.

2. A wiring board production method according to claim 1, wherein the conductive region is a wiring line extending from the substrate terminals.

3. An electrooptical apparatus production method including a step of implementing the wiring board production method according to claim 1.

4. An electronic device production method including a step of implementing the electrooptical apparatus production method according to claim 3.

* * * * *